United States Patent
Massey et al.

(10) Patent No.: US 12,259,453 B2
(45) Date of Patent: Mar. 25, 2025

(54) SYSTEMS AND METHODS FOR VECTOR-SHORT-OPEN-CALIBRATION DE-EMBEDDING OF MICROWAVE CIRCUITS

(71) Applicant: Murata Manufacturing Co., Ltd., Nagaokakyo (JP)

(72) Inventors: Jackson W. Massey, Austin, TX (US); Amir Hajiaboli, Austin, TX (US); Vladimir I. Okhmatovski, Winnipeg (CA)

(73) Assignee: Murata Manufacturing Co., Ltd., Nagaokakyo (JP)

(*) Notice: Subject to any disclaimer, the term of this patent is extended or adjusted under 35 U.S.C. 154(b) by 725 days.

(21) Appl. No.: 17/563,884

(22) Filed: Dec. 28, 2021

(65) Prior Publication Data
US 2022/0206099 A1     Jun. 30, 2022

Related U.S. Application Data

(60) Provisional application No. 63/131,231, filed on Dec. 28, 2020.

(51) Int. Cl.
*G01R 35/00* (2006.01)
*G01R 27/28* (2006.01)

(52) U.S. Cl.
CPC .......... *G01R 35/005* (2013.01); *G01R 27/28* (2013.01)

(58) Field of Classification Search
USPC .............................................. 716/111
See application file for complete search history.

(56) References Cited

U.S. PATENT DOCUMENTS

| 5,155,050 A | * | 10/1992 | Bayraktaroglu | G01S 13/91 438/606 |
| 7,328,195 B2 | * | 2/2008 | Willis | G06F 30/367 706/14 |
| 2022/0206099 A1 | * | 6/2022 | Massey | G01R 27/28 |

* cited by examiner

*Primary Examiner* — Mohammed Alam
(74) *Attorney, Agent, or Firm* — ArentFox Schiff LLP

(57) ABSTRACT

A method of de-embedding a feed line is shown. The method includes measuring network parameters of a multilayered planar substrate and obtaining network parameters of a feed line using a short-open-calibration (SOC) according to an ABCD-matrix. An "a" block of the ABCD-matrix includes a first matrix multiplied by a transpose of a first short-circuit current. The first matrix is an inverse of a difference of an open-circuit current and a second short-circuit current. A "c" block of the ABCD-matrix includes the open-circuit current multiplied by the "a" block. The method includes de-embedding the network parameters of the feed line from the network parameters of the multilayered planar substrate to obtain microwave circuit network parameters and, responsive to the microwave circuit network parameters being within or not within a specified range, respectively approving or rejecting customer shipment of the microwave circuit.

20 Claims, 13 Drawing Sheets

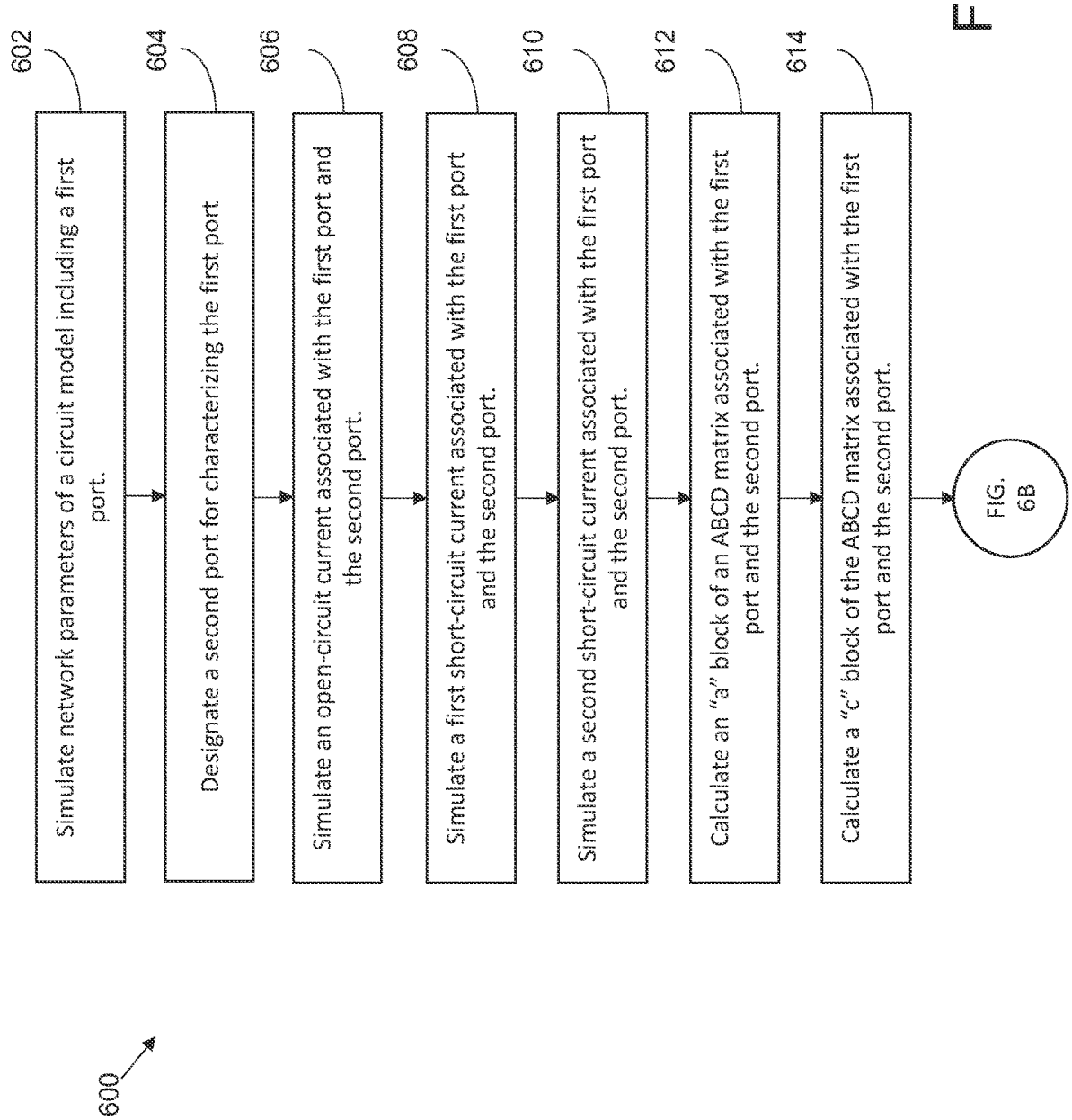

700

|  |  |  |
|---|---|---|
| $V_s^1$ | $V_s^2$ ... $V_s^p$ | |
| 1 | 0 ... 0 | $\mathcal{E}_{1,1}^{inc} = V_{1,1}\delta(p_1 - p_1^t)\hat{p}_1$   $I_{1,1}$   $I_{2,1}$   $V_{2,1}$ |
| 0 | 1 ... 0 | $\mathcal{E}_{1,2}^{inc} = V_{1,2}\delta(p_2 - p_2^t)\hat{p}_2$   $I_{1,2}$   $I_{2,2}$   $V_{2,2}$ |
| 0 | 0 ... 0 | $\mathcal{E}_{1,3}^{inc} = V_{1,3}\delta(p_3 - p_3^t)\hat{p}_3$   $I_{1,3}$   $I_{2,3}$   $V_{2,3}$ |
| ... | ... | ... |
| 0 | 0 ... 1 | $\mathcal{E}_{1,p}^{inc} = V_{1,p}\delta(p_p - p_p^t)\hat{p}_p$   $I_{1,p}$   $I_{2,p}$   $V_{2,p}$ |
|  | | $V_1$ $I_1$     $I_2$   $V_2$ |

FIG. 7

SYSTEMS AND METHODS FOR VECTOR-SHORT-OPEN-CALIBRATION DE-EMBEDDING OF MICROWAVE CIRCUITS

RELATED APPLICATIONS

This application claims the benefit of and priority to U.S. Provisional Patent Application No. 63/131,231, entitled "Systems and Methods for Vector-Short-Open-Calibration De-Embedding of Microwave Circuits," filed Dec. 28, 2020, the entirety of which is incorporated by reference herein.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

FIELD

This disclosure relates to spectral analysis of electronic circuits.

DESCRIPTION OF THE RELATED ART

Electronic Design Automation (EDA) tools using the Method of Moments (MoM) may be used in the characterization of microwave circuits, components, high-speed interconnects, and other structures. De-embedding of port discontinuities in MoM-based EDA models is a key process to obtain network parameters free of the effect of fringing fields present at the ports. De-embedded parameters allow for cascading microwave components into larger systems, establishing port termination of distributed circuit ports with lumped circuits, and providing various other capabilities essential to microwave design flow and design of high-speed digital links.

DESCRIPTION OF THE DRAWINGS

FIGS. 6A-6B shows a flow chart of a method for de-embedding a port discontinuity through simulation, according to some implementations.

FIG. 7 shows a general distributed circuit with two groups of ports, according to some implementations.

DETAILED DESCRIPTION

The Vector Short-Open-Calibration (VSOC) methodology has become a popular approach for de-embedding port discontinuities, such as in MoM-based EDA tools. However, many implementations of VSOC include fundamental mistakes in the VSOC relationships. The cause for these mistakes is the incorrect use of the reciprocity relationship for an ABCD-matrix of a general multiport microwave circuit. Depending on the particular circuit configuration, these mistakes manifest themselves to a different degree of severity which may not be easily detectable.

The correct identification of the reciprocity relationship, presented herein, has allowed for an improved approach to VSOC de-embedding that allow for correct analysis of network parameters, avoiding the errors introduced by other implementations not utilizing this relationship. Described herein are embodiments of a system and method for accurately de-embedding (e.g., removing effects of) feed line networks and port discontinuities. In some embodiments, network parameters of a feed line network or port network are obtained using an improved VSOC methodology that uses ABCD-parameters in which the "a" block includes a first matrix multiplied by the transpose of a first short-circuit current; the first matrix is the inverse of a difference of an open-circuit current and a second short-circuit current; and a "c" block of the ABCD-matrix comprises the open-circuit current multiplied by the "a" block. This is different from other implementations of VSOC methodology that use ABCD-parameters in which the "a" block includes the first short-circuit current (which is not transposed) multiplied by the first matrix (so that the matrix-multiplication is in reverse order), and a "c" block of the ABCD-matrix comprises the open-circuit current matrix-multiplied by the "a" block, and avoids errors introduced by such implementations in some instances of circuit architectures.

Embodiments of the present disclosure demonstrate a technological improvement as compared to the previous de-embedding techniques. More accurate de-embedding enables more accurate network parameter characterization of microwave systems, millimeter wave systems, and digital interconnect systems, whether in pre-fabrication simulation or in post-fabrication measurement. The characterized models can be an input to a manufacturing process and the characterized physical substrates can be shipped to customers. More accurate de-embedding and characterization ensures a better product yield and compliance to specifications with tighter margins.

Figure 1:
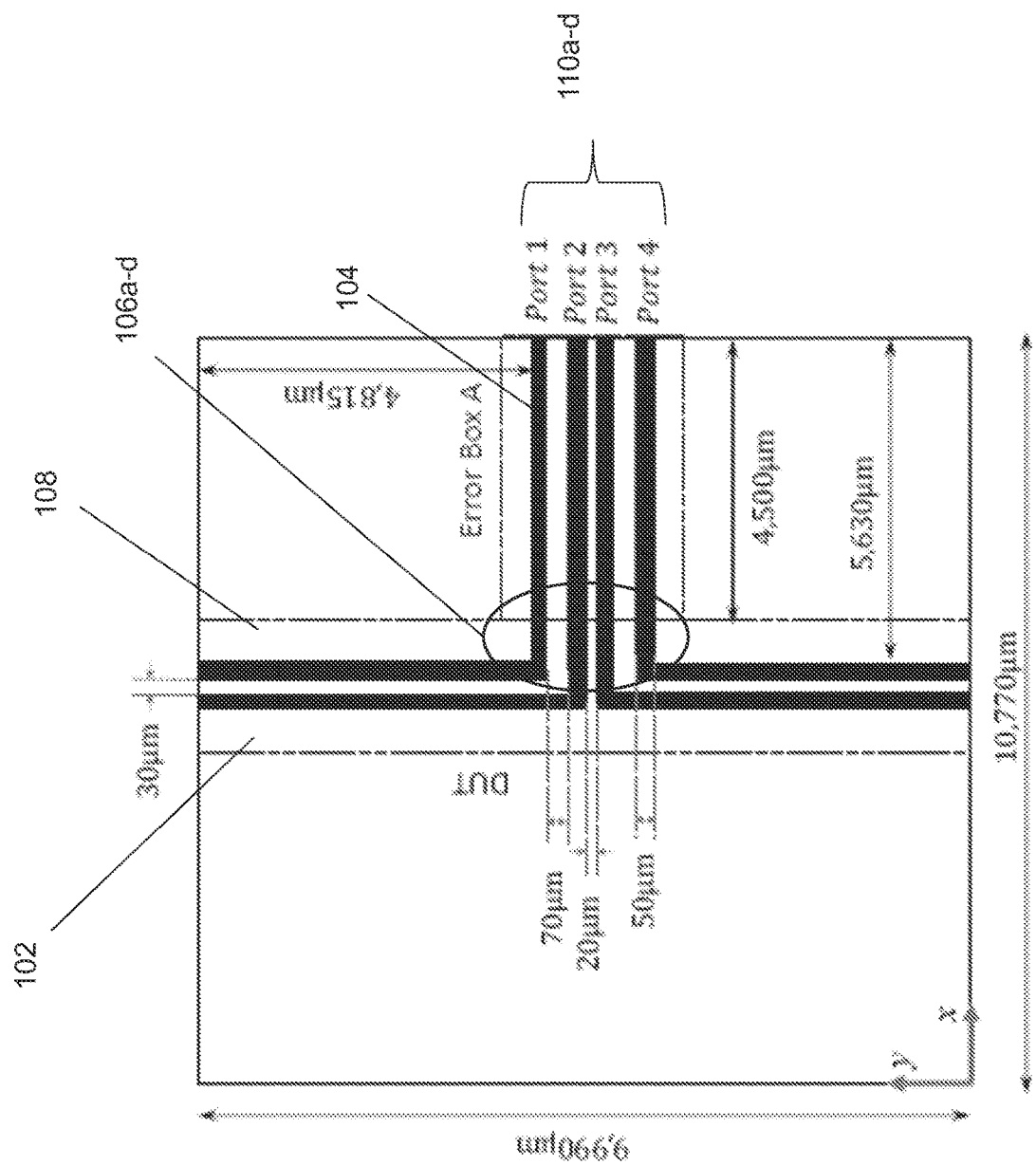
FIG. 1 shows a schematic diagram of a multilayered planar substrate, according to some implementations.

FIG. 1 shows a schematic diagram of a multilayered planar substrate 100, according to some implementations. The multilayered planar substrate 100 illustrated includes a microwave circuit 102 and a feed line network 104. The microwave circuit 102 and the feed line network 104 are coupled to first ports 106*a-d* at a reference plane 108. The feed line network 104 is coupled to second ports 106*a-d*. Although four first ports and four second ports are shown, the multilayered planar substrate 100 can include any number of ports in various implementations. In some embodiments, the multilayered planar substrate is a printed circuit board. In some embodiments, the microwave circuit 102 is a distributed microwave circuit.

The microwave circuit 102 in FIG. 1 is shown as a mock-up 4-line splitter. The multilayered planar substrate 100 in FIG. 1 is shown as a shielded, layered medium in which the splitter is situated. In the illustrated example, the layered medium is formed by a ground-backed single-layer substrate with a thickness of 200 µm, relative permittivity of 51, and loss tangent of 0.002. The lateral dimensions of the example shielding box are 10770 µm by 9990 µm over x and y coordinates, respectively, and its height from the ground plane is 410 µm in the z direction.

The box is covered both at the top and at the bottom with PEC ground planes in the example illustrated. The width of the thin PEC microstrip conductors is 50 µm and the spacings between the conductors are shown in FIG. 1. The feed line network 104 is shown as a uniform error box A of 4 500 µm length is introduced at the right wall of the rectangular enclosure and de-embedded using VSOC.

Figure 2:
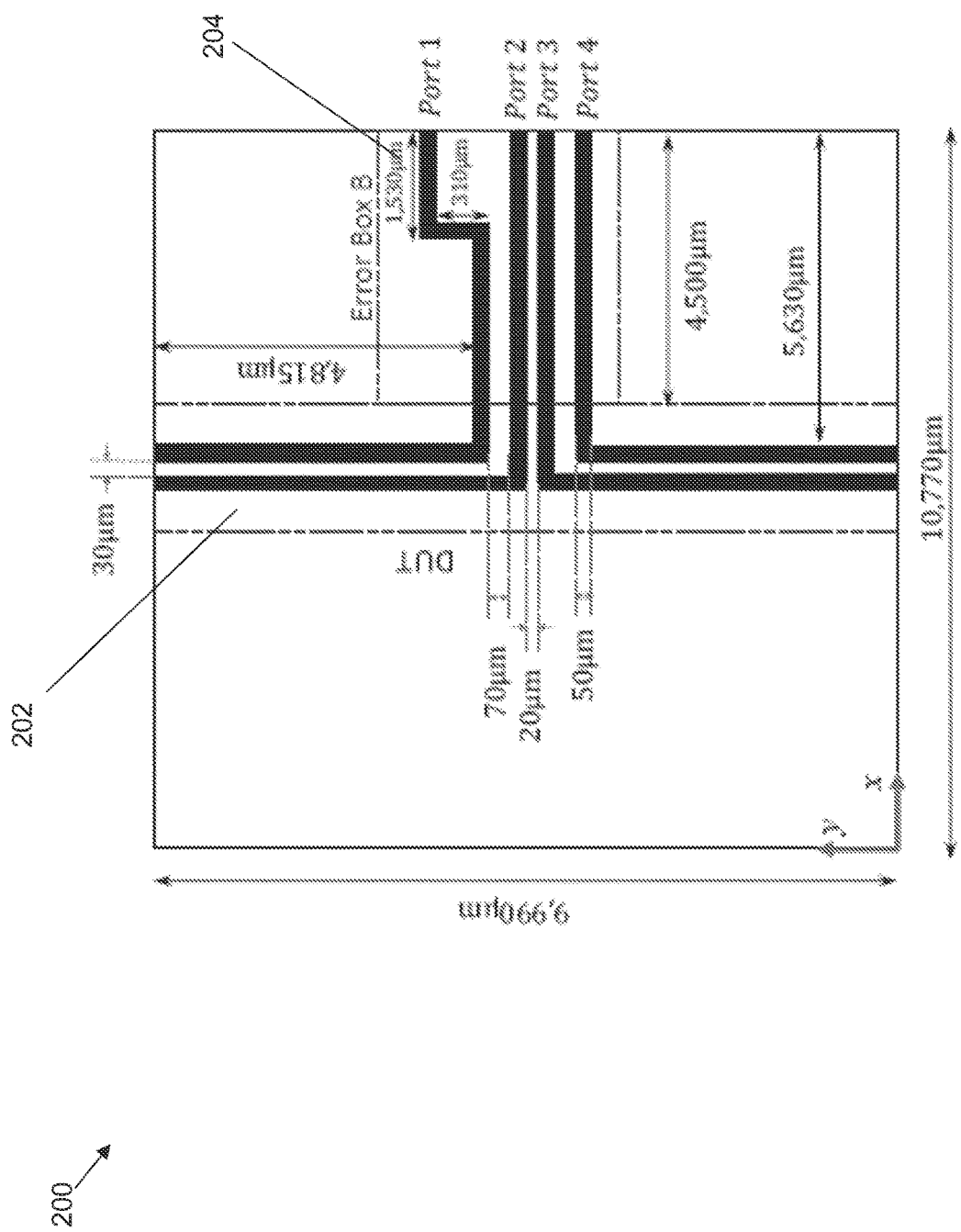
FIG. 2 shows a schematic diagram of a multilayered planar substrate, according to some implementations.

FIG. 2 shows a schematic diagram of a multilayered planar substrate 200. The multilayered planar substrate 200 illustrated includes the microwave circuit 202 and a feed line network 204. In the second example of FIG. 2, the microwave circuit 202 is shown as the same splitter as in FIG. 1, but the feed line network 204 is shown as a non-uniform error box B.

Figure 3:
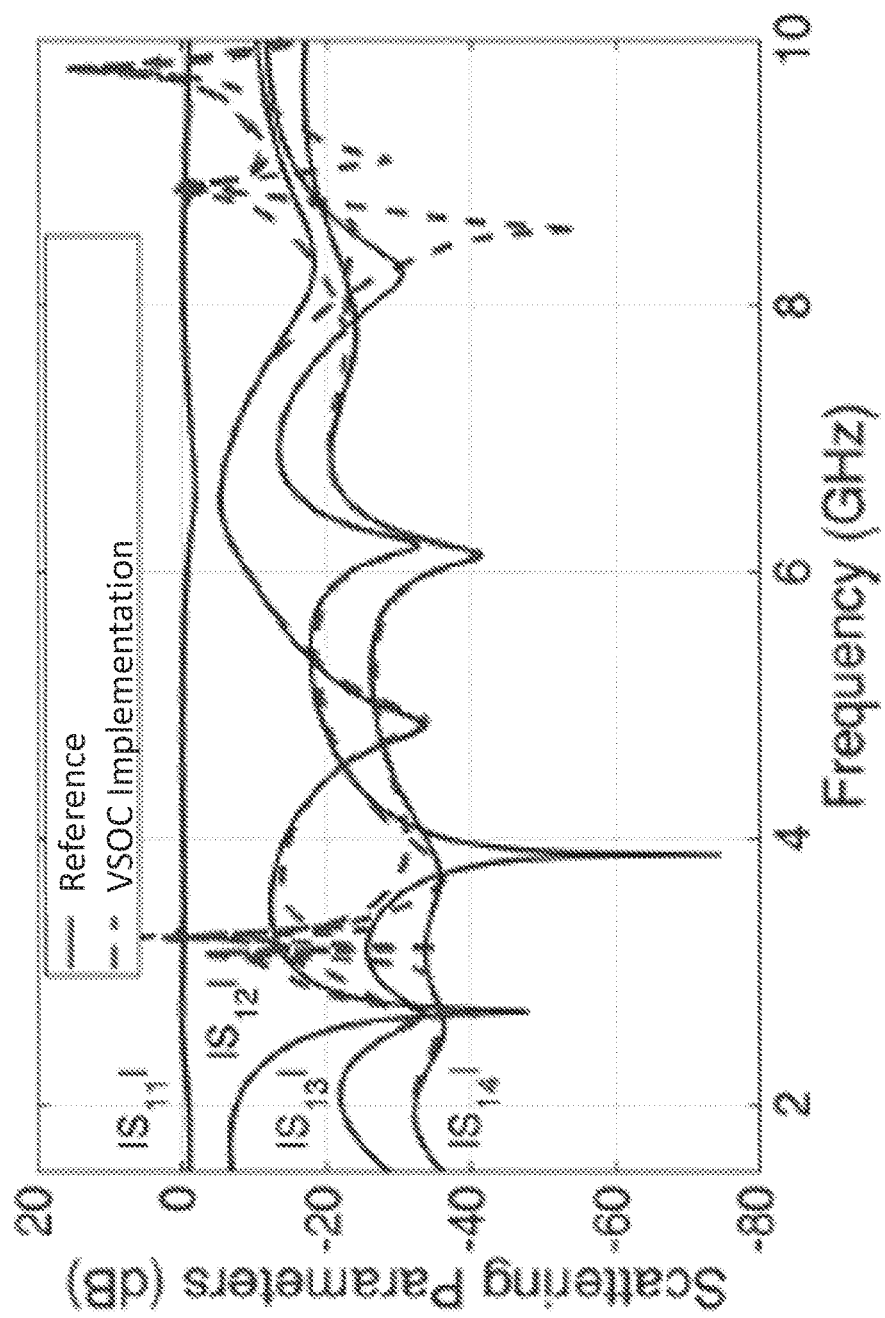
FIG. 3 is a graph of S-parameters versus frequency comparing an embodiment of a VSOC methodology to a reference, according to some implementations.

FIG. 3 is a graph 300 of S-parameters versus frequency comparing, to a reference shown in solid line, an implementation of a VSOC methodology not based on the systems and methods discussed herein (referred to as an "alternate VSOC methodology" herein). The example of FIG. 3 demonstrates the impact from the use of incorrect definitions of blocks a and c on the accuracy of VSOC de-embedding and generality of the developed VSOC formulation. FIG. 3 shows de-embedded S-parameters of the microwave circuit 102 of FIG. 1 as the dotted line. The S-parameters are derived using an incorrect alternate VSOC methodology to de-embed the feed line network 104 from the microwave circuit 102. The ABCD-matrix of the feed line network 104 is defined using incorrect expressions for blocks a and c. The incorrect expressions are as follows:

$$a = IS' \cdot (IO - IS)^{-1}, \quad (1)$$

$$c = IO \cdot IS' \cdot (IO - IS)^{-1}. \quad (2)$$

Accurate de-embedded S-parameters computed by an EDA tool are included in the same FIG. 3 for reference, which are shown as the solid line. The behavior of the S-parameters obtained using the incorrect alternate VSOC methodology is grossly incorrect in distinct frequency bands from around 2.5 GHz to 4.5 GHz and 7.5 GHz to 10 GHz. Such behavior is caused by the erroneous definition of the ABCD matrix of the error box.

Figure 4:
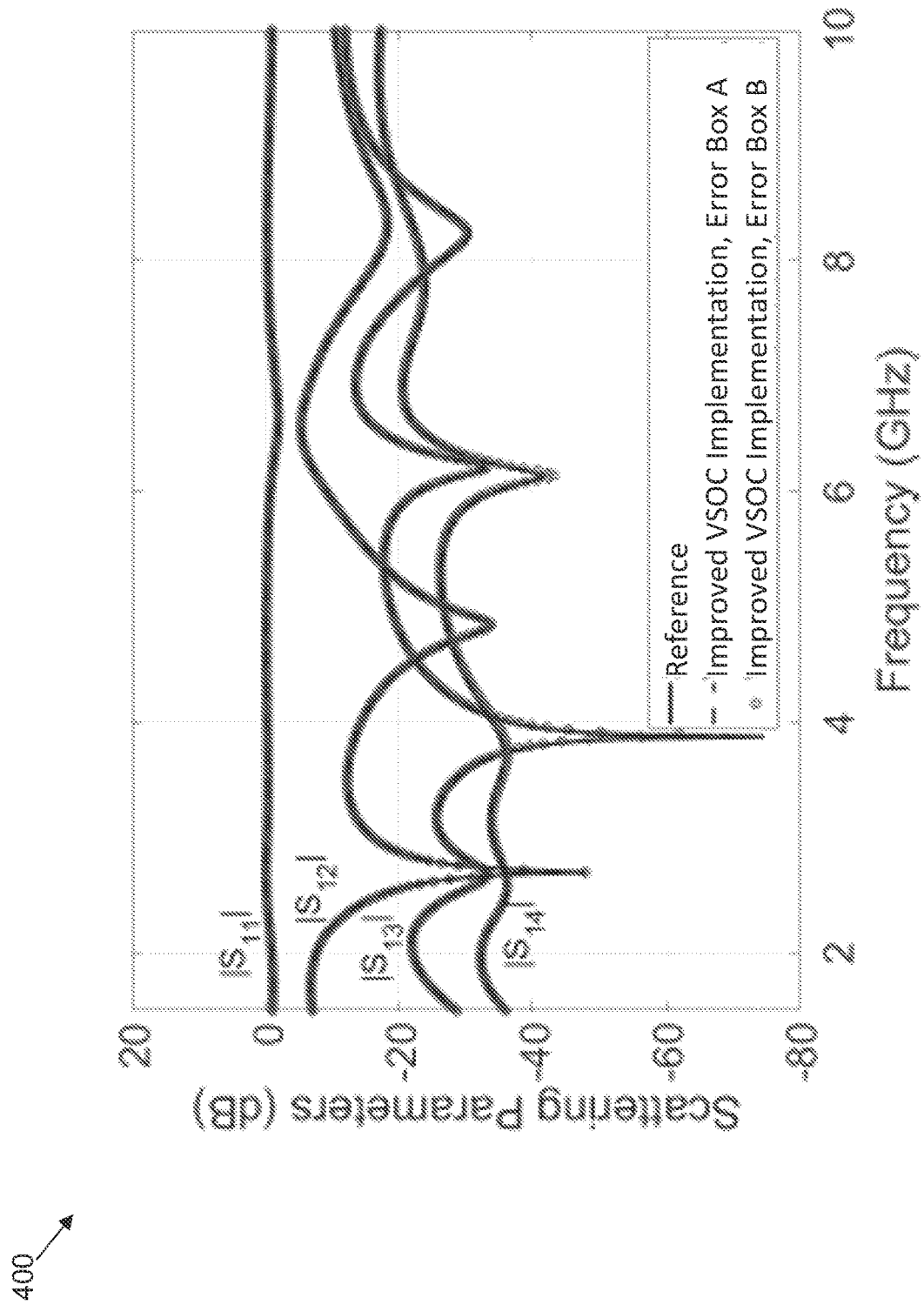
FIG. 4 is a graph of S-parameters versus frequency comparing another embodiment of a VSOC methodology to a reference, according to some implementations.

FIG. 4 is a graph 400 of S-parameters versus frequency comparing an embodiment of the improved VSOC methodology of the present disclosure to a reference. FIG. 4 shows de-embedded S-parameters of the microwave circuit 102 and the microwave circuit 202, which are shown as the dotted line and the circle-symbol line, respectively. The S-parameters are derived using the correct VSOC methodology to de-embed the feed line network 104 and the feed line network 204 from the microwave circuit 102 and the microwave circuit 202, respectively. With the use of the corrected definitions of the a and c blocks in the ABCD-matrix, the VSOC produces accurate de-embedded S-parameters in the entire range of frequencies. The corrected definitions of the a and c blocks are as follows:

$$a = VO'^{-1} = (IO - IS)^{-1} \cdot [IS']^t, \quad (3)$$

$$c = IO \cdot VO'^{-1} = IO - (IO - IS)^{-1} \cdot [IS']^t. \quad (4)$$

Using the correct VOSC methodology, the computing device closely matches the de-embedded S-parameters to those obtained for the microwave circuit 102 by an EDA tool.

Figure 5A:
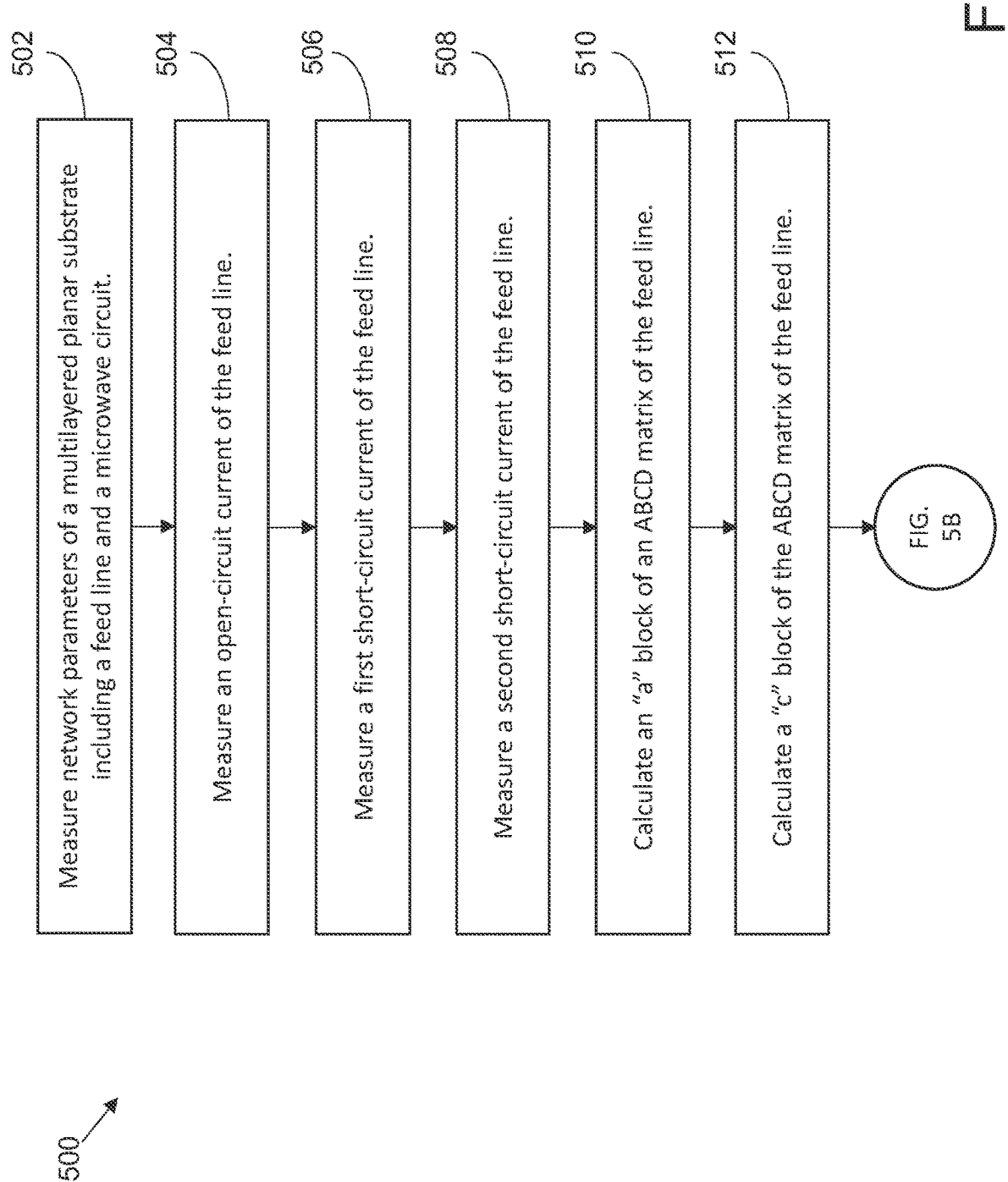
FIGS. 5A-5B shows a flow chart of a method for de-embedding a feed line through measurement, according to some implementations.
Figure 5B:
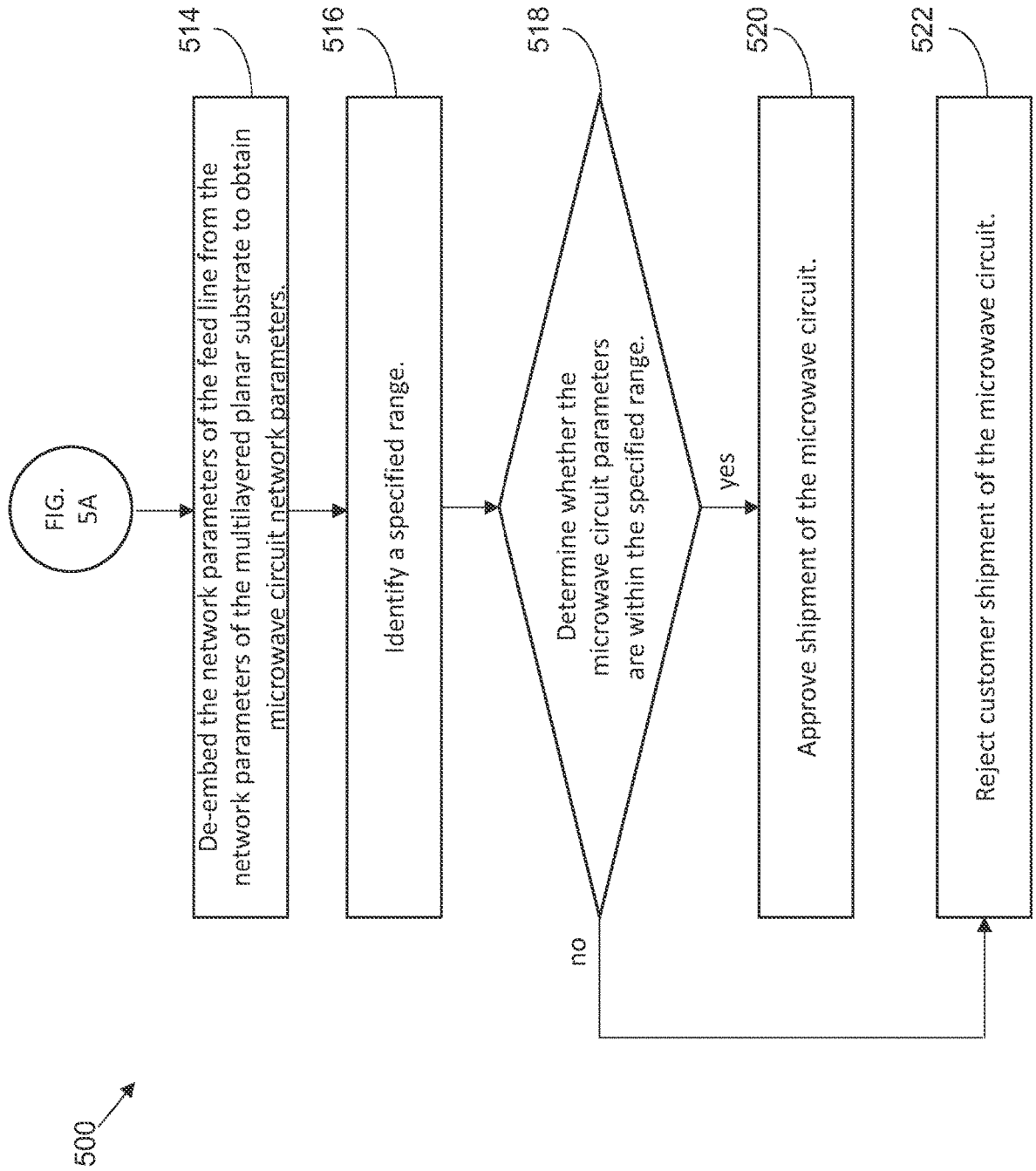

FIG. 5 shows a flow chart of a method 500 for de-embedding a feed line through measurement, according to some implementations. The method 500 may be performed by a computing device or devices, comprising one or more processors executing instructions, such as laboratory test equipment. Additional, fewer, or different operations may be performed in the method 500 depending on the embodiment.

The computing device measures network parameters of a multilayered planar substrate including a feed line and a microwave circuit (at step 502), or receives such parameters from another measurement device. For example, the substrate includes a plurality of ports at its boundaries. The computing device or other measurement device may send excitation signals at each one of the plurality of ports, place a load on remaining ports, and measure response signals generated at each of the plurality of ports.

The multilayered planar substrate includes a first port and a second port. In some embodiments, the first port is at a reference plane coupled to the microwave circuit and the second port coincides with a boundary of the multilayered planar substrate. One or more of the feed line or the second port generates discontinuities. The discontinuity may be due to an effect of fringing fields present at the feed line or the second port. The computing device or measurement device measures an open-circuit current (e.g., a current at a first port with a second port in open-circuit configuration) of the feed line, with reference to the first and second port (at step 504). For example, the computing device or measurement device measures a first short-circuit current of the feed line, with reference to the first and second port (at step 506); and measures a second-short circuit current of the feed line, with reference to the first and second port (at step 508).

The computing device or measurement device obtains network parameters of the feed line using a short-open-calibration (SOC) according to an ABCD-matrix. The computing device or measurement device calculates an "a" block of an ABCD matrix of the feed line (at step 510). An "a" block of the ABCD-matrix includes a first matrix multiplied by the transpose of the first short-circuit current. The first matrix is the inverse of the difference of the open-circuit current and the second short-circuit current. Generally, the "a" block is a voltage ratio of an input and an output of a transmission line. See equation (3) above. The computing device calculates a "c" block of the ABCD matrix of the feedline (at step 512). A "c" block of the ABCD-matrix includes the open-circuit current multiplied by the "a" block. Generally, the "c" block is a short circuit resistance of a transmission line. See equation (4) above.

The computing device de-embeds the network parameters of the feed line from the network parameters of the multilayered planar substrate to obtain (de-embedded) microwave circuit network parameters (at step 514). This can be achieved by converting the feed line ABCD parameters to feed line S-parameters and subtracting the feed line S-parameters from substrate S-parameters. Thus, the computing device de-embeds any discontinuities associated with one or more of the feed line or the second port. In some embodiments, the network parameters are S-parameters.

The computing device identifies a specified range (at step 516). Specified range includes response specifications at a predefined frequency interval. For example, the specified range includes +/−3 dB from a target S21 at frequencies between 5-7 GHz. In some embodiments, the specified range includes frequency specifications. For example, the specified range includes a pole at +/−1 MHz. In some implementations, the computing device compares the microwave circuit network parameters to the specified range. The computing device determines whether the microwave circuit parameters are within the specified range (at step 518). The specified range may be included in a product specification. If the computing device determines that the microwave circuit network parameters are within the specified range, the computing device approves continued production and/or customer shipment of the microwave circuit (at step 520). If the computing device determines that the microwave circuit network parameters are not within the specified range, the computing device rejects continued production and/or customer shipment of the microwave circuit (at step 522). In some embodiments, reports identifying errors in the network parameters may be generated and provided to an administrator, designer, or manufacturer.

Figure 6B:
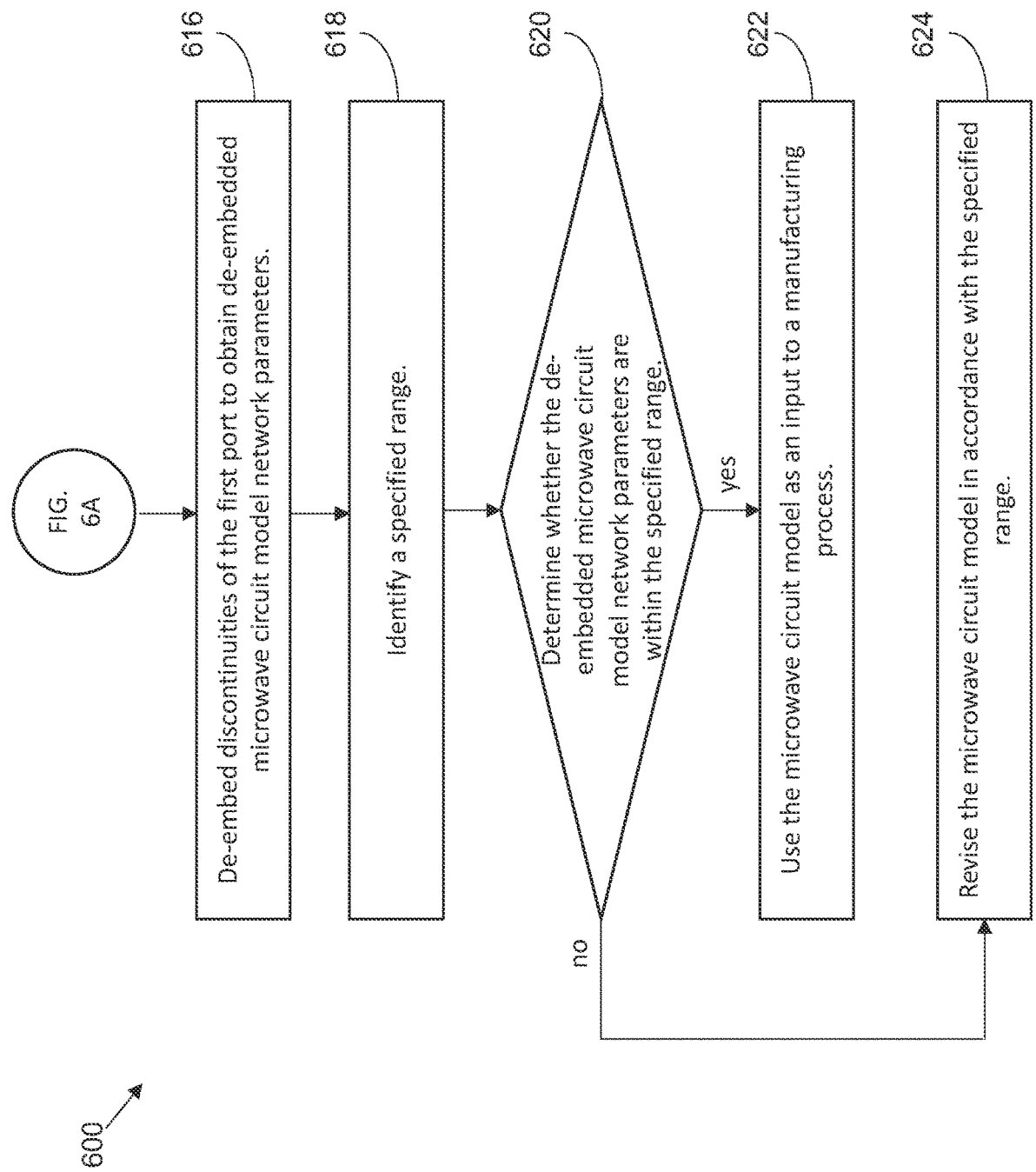

A similar implementation of the method discussed above may be used as part of a manufacturing process, during design of circuits, by simulating characteristics of a circuit. FIG. 6 shows a flow chart of a method 600 for de-embedding a port discontinuity through simulation, according to some implementations. The method 600 may be performed by a computing device or devices, comprising one or more processors executing instructions for simulating network parameters of a circuit model (e.g., an EDA tool). Additional, fewer, or different operations may be performed in the method 600 depending on the embodiment. Operations of the method 600 may be combined with operations of the method 500.

A computing device simulates network parameters of a microwave circuit model including a first port (at step 602). For example, the microwave circuit model includes various sub-model (e.g., sub-circuit/component/sub-layout models) that are interconnected in a network. In some embodiments, the sub-models are represented as one or more of resistors, inductors, capacitors, current sources, or voltage sources. Each sub-model has its own S-parameters, and may be found on a netlist. The computing device cascades (e.g., adds together) the S-parameters of the models to determine the S-parameters of the microwave circuit model.

The computing device designates a second port (e.g., a reference port) for characterizing the first port (at step 604). The reference port allows the first port to be characterized using multi-port network parameters. The computing device can place the reference port anywhere in the microwave circuit model. The reference port may be virtual, i.e., not a part of a microwave structure that is fabricated based on the microwave circuit model. In some embodiments, the microwave circuit model includes a feed line coupling the port and the reference port. In some embodiments, the feed line is ideal, e.g., has no phase shift and no loss from one port to the other, such that the feed line allows the first port to be characterized using multi-port network parameters. In some embodiments, the feed line is not ideal, e.g., has a phase shift and loss from one port to the other.

In some implementations, the computing device may simulate an open-circuit current associated with the first port and the second port (at step 606); may simulate a first short-circuit current associated with the first port and the second port (at step 608); and may simulate a second-short circuit current associated with the first port and the second port (at step 610). The computing device obtains network parameters associated with the port using a short-open-calibration (SOC) according to an ABCD-matrix. The computing device calculates an "a" block of the ABCD-matrix associated with the first port and the second port (at step 612). The "a" block of the ABCD-matrix includes a first matrix multiplied by the transpose of the first short-circuit current. The first matrix is the inverse of the difference of the open-circuit current and the second short-circuit current. The computing device calculates a "c" block of the ABCD-matrix associated with the first port and the second port (at step 614). The "c" block of the ABCD-matrix includes the open-circuit current matrix-multiplied by the "a" block.

The computing device de-embeds discontinuities of the first port to obtain de-embedded microwave circuit model network parameters (e.g., microwave circuit model network parameters with effects of discontinuities removed) (at step 616). The computing device identifies a specified range (at step 618). In some embodiments, the computing device compares the de-embedded microwave circuit model network parameters to a frequency specification or specified range. The computing device determines whether the de-embedded microwave circuit model network parameters are within the specified range (at step 620). If the computing device determines that the de-embedded microwave circuit network parameters are within the specified range, the computing device uses/approves/sends/instructs a user to send the microwave circuit model as an input to a manufacturing process (at step 622). The manufacturing process may include fabricating a multilayer planar substrate based on the microwave circuit model. If the computing device determines that the de-embedded microwave circuit network parameters are not within the specified range, the computing device revises/instructs the user to revise the microwave circuit model in accordance with the specified range (at step 624).

FIG. 7 shows a model of a general distributed circuit 700 (e.g., multiport circuit) with two groups of ports, according to some implementations. The two groups of ports include a group of P ports on the left and P ports on the right as depicted in FIG. 7. For such a circuit with two groups of ports, the ABCD-matrix relating vectors of voltages and currents is defined as $$\begin{bmatrix} V_1 \\ I_1 \end{bmatrix} = \begin{bmatrix} a & b \\ c & d \end{bmatrix} \cdot \begin{bmatrix} V_2 \\ -I_2 \end{bmatrix}, \quad (5)$$

where P×1 vectors of voltages and currents for the left group of ports are defined as as $V_1=[V_{1,1}, V_{1,2}, \ldots, V_{1,P}]$ and $I_1=[I_{1,1}, I_{1,2}, \ldots, I_{1,P}]$. Vectors of voltages $V_2$ and currents $I_2$ for the group of P ports on the right are the multiconductor transmission line currents and voltages $V_2=[V_{2,1}, V_{2,2}, \ldots, V_{2,P}]$ and $I_2=[I_{2,1}, I_{2,2}, \ldots, I_{2,P}]$. Respective coordinates $p_j$ are co-linear with the directions $\hat{p}i$ of the electric field $E_{1,i}^{inc}$ in ith δ-gap port, i=1, ..., P.

Applying P linearly independent P×1 vectors of voltages $V_s$ to the left group of ports yields:

$$V_s = [V_s^1, V_s^2, \ldots, V_s^P] = \begin{bmatrix} 1 & 0 & \ldots & 0 \\ 0 & 1 & \ldots & 0 \\ \vdots & \vdots & \ddots & \vdots \\ 0 & 0 & \ldots & 1 \end{bmatrix} = I, \quad (6)$$

where I is the identity matrix (idem-factor). The following P vectors of currents $I_2|_{V_2=0}$ on the right group of ports can be recorded under condition of vanishing voltages $V_2=0$ ('forward experiment'), $$I_2|_{V_2=0} = [I_2^1, I_2^2, \ldots, I_2^P]|_{V_2=0} = \begin{bmatrix} I_{2,1}^1 & I_{2,1}^2 & \ldots & I_{2,1}^P \\ I_{2,2}^1 & I_{2,2}^2 & \ldots & I_{2,2}^P \\ & & \ddots & \\ I_{2,P}^1 & I_{2,P}^2 & \ldots & I_{2,P}^P \end{bmatrix}\Bigg|_{V_2=0} \quad (7)$$

Similarly, applying P linearly-independent P×1 vectors of voltages $V_s$ to the right group of ports, P vectors of currents $I_1|_{V_1=0}$ on the left group of ports can be recorded under condition of vanishing voltages $V_1=0$ ('backward experiment'). These relations between matrices of currents and voltages can be formally stated as $$Y_{21} \cdot V_s = I_2|_{V_2=0}, \text{ and} \quad (8)$$

$$Y_{12} \cdot V_s = I_1|_{V_1=0}, \quad (9)$$

where $Y_{12}$ and $Y_{21}$ are the off-diagonal blocks of the Y-matrix for the multiport circuit relating currents $I_1$ and $I_2$ to voltages $V_1$ and $V_2$, as follows:

$$\begin{bmatrix} I_1 \\ I_2 \end{bmatrix} = \begin{bmatrix} Y_{11} & Y_{12} \\ Y_{21} & Y_{22} \end{bmatrix} \cdot \begin{bmatrix} V_1 \\ V_2 \end{bmatrix}. \quad (10)$$

In a reciprocal system, the Y-matrix is symmetric, leading to the following relationship of off-diagonal blocks $$Y_{12} = Y_{21}^t, \quad (11)$$

where 't' denotes matrix transposition.

Considering excitation on the left side ('forward experiment'), i.e., using conditions $V_1=V_s$ and $V_2=0$ with notation $I_2=I_2|_{V_2=0}$, the following relation is obtained according to the ABCD-parameters definition in equation (5) and $Y_{21}$ block definition in equation (8):

$$I_2 = Y_{21} \cdot V_s = -b^{-1} \cdot V_s. \quad (12)$$

Next, considering excitation on the right side ('backward experiment') with conditions $V_2=V_s$ and $V_1=0$ with notation $I_1=I_1|_{V_1=0}$, the following is obtained from equation (5):

$$0 = a \cdot V_s - b \cdot I_2, \quad (13)$$

$$I_1 = c \cdot V_s - d \cdot I_2. \quad (14)$$

Solving equation (13) for $I_2$ yields $$b \cdot I_2 = a \cdot V_s, \; I_2 = b^{-1} \cdot a \cdot V_s. \quad (15)$$

Plugging equation (15) into (14) yields $$I_1 = (c - d \cdot b^{-1} \cdot a) \cdot V_s. \quad (16)$$

The above relationship in equation (16) is equivalent to the relationship shown in equation (9) with the off-diagonal Y-matrix block definition $Y_{12}=c-d\cdot b^{-1}\cdot a$. For reciprocity $Y_{12}=Y_{21}^t$ to hold, matrix $-[b^{-1}]^t$ in (12) and matrix $(c-d\cdot b^{-1}\cdot a)$ in equation (16) must be equal, i.e., $$(d \cdot b^{-1} \cdot a - c) = [b^{-1}]^t. \quad (17)$$

Since the transpose of the inverse is equal to the inverse of the transpose, i.e., $[b^{-1}]^t=[b^t]^{-1}$, pre-multiplying and post-multiplying equation (17) with $b^t$ results in two identities from the reciprocity $$I = (d \cdot b^{-1} \cdot a - c) \cdot b^t, \quad (18)$$

$$I = b^t \cdot (d \cdot b^{-1} \cdot a - c). \quad (19)$$

Note that the reciprocity relationships in equations (18) and (19) between the ABCD-matrix blocks "a," "b," "c," and "d" are generalizations to the case of multiport circuits of the familiar reciprocity relationship $a\cdot d-c\cdot b=1$ in 2-port circuits. In some derivations not based on the systems and methods discussed herein, the reciprocity relationship may be incorrectly stated as $I=a\cdot d-c\cdot b$, which led to erroneous definitions of blocks "a" and "c" in the ABCD-matrix of the error boxes.

The 2P port microwave circuit in FIG. 4 to represent one of the error boxes in the VSOC methodology can be used for de-embedding port discontinuities in a general microwave system. In VSOC, the blocks of the ABCD-matrix for the error box are obtained from the experiments forcing short ($V_2=0$) and open ($I_2=0$) terminations at the right group of ports. The voltage matrix at the right ports $V_2$ and currents at the left ports $I_1$ under the condition of open termination ($I_2=0$) and linearly independent excitations $V_1=V_S=I$ are denoted as VO' and IO, i.e.

$$VO' = V_2|_{I_2=0}, IO = I_1|_{I_2=0}, \quad (20)$$

and related through ABCD-matrix as $$\begin{bmatrix} I \\ IO \end{bmatrix} = \begin{bmatrix} a & b \\ c & d \end{bmatrix} \cdot \begin{bmatrix} VO' \\ 0 \end{bmatrix}. \quad (21)$$

The currents at the left and right ports $I_1$, $I_2$ under the condition of short termination ($V_2=0$) and linearly independent excitations $V_1=V_s=I$ are denoted as IS and IS', i.e.

$$IS = I_1|_{V_2=0}, IS' = I_2|_{V_2=0}, \quad (22)$$

and related through ABCD-matrix as $$\begin{bmatrix} I \\ IS \end{bmatrix} = \begin{bmatrix} a & b \\ c & d \end{bmatrix} \cdot \begin{bmatrix} 0 \\ -IS' \end{bmatrix}. \quad (23)$$

The blocks "a" and "c" of the ABCD-matrix of the error box can be determined using voltages and currents in the open experiment IO, VO' from equation (21)

$$a = VO'^{-1}, c = IO \cdot VO'^{-1}. \quad (24)$$

The blocks "b" and "d" of the ABCD-matrix of the error box shown in equation (5) can be determined using currents in the short experiment IS and IS' using equation (23), with $$b = IS'^{-1}, d = -IS \cdot IS'^{-1}. \quad (25)$$

Voltages VO' at the right ports in the open experiment cannot be easily obtained from the MoM computations. For that reason, matrix VO' is eliminated from definition of blocks "a" and "c" in equation (24) by substituting equations (24) and (25) into the reciprocity relation shown in equation (19) yielding $$I = (-IS'^{-1})^t \cdot \left[ (-IS \cdot IS'^{-1}) \cdot (-IS'^{-1})^{-1} \cdot (VO'^{-1}) - (IO \cdot VO'^{-1}) \right]. \quad (26)$$

Simplifying (26) yields $$I = (-IS'^{-1})^t \cdot [IS \cdot VO'^{-1} - IO \cdot VO'^{-1}]. \quad (27)$$

Right multiplication of equation (27) by VO' produces the desired expression for VO' in terms of easily measurable (when using MoM) currents IO, IS, and IS'

$$VO' = (IS'^{-1})^t \cdot [IO - IS]. \quad (28)$$

Substitution of equation (28) into equation (24) followed by use of identity $(IS'^{-1})^t = [[IS']^t]^{-1}$ gives the final correct expressions for blocks "a" and "c" of the ABCD-matrix (formulae (3) and (4), above).

Figure 8:
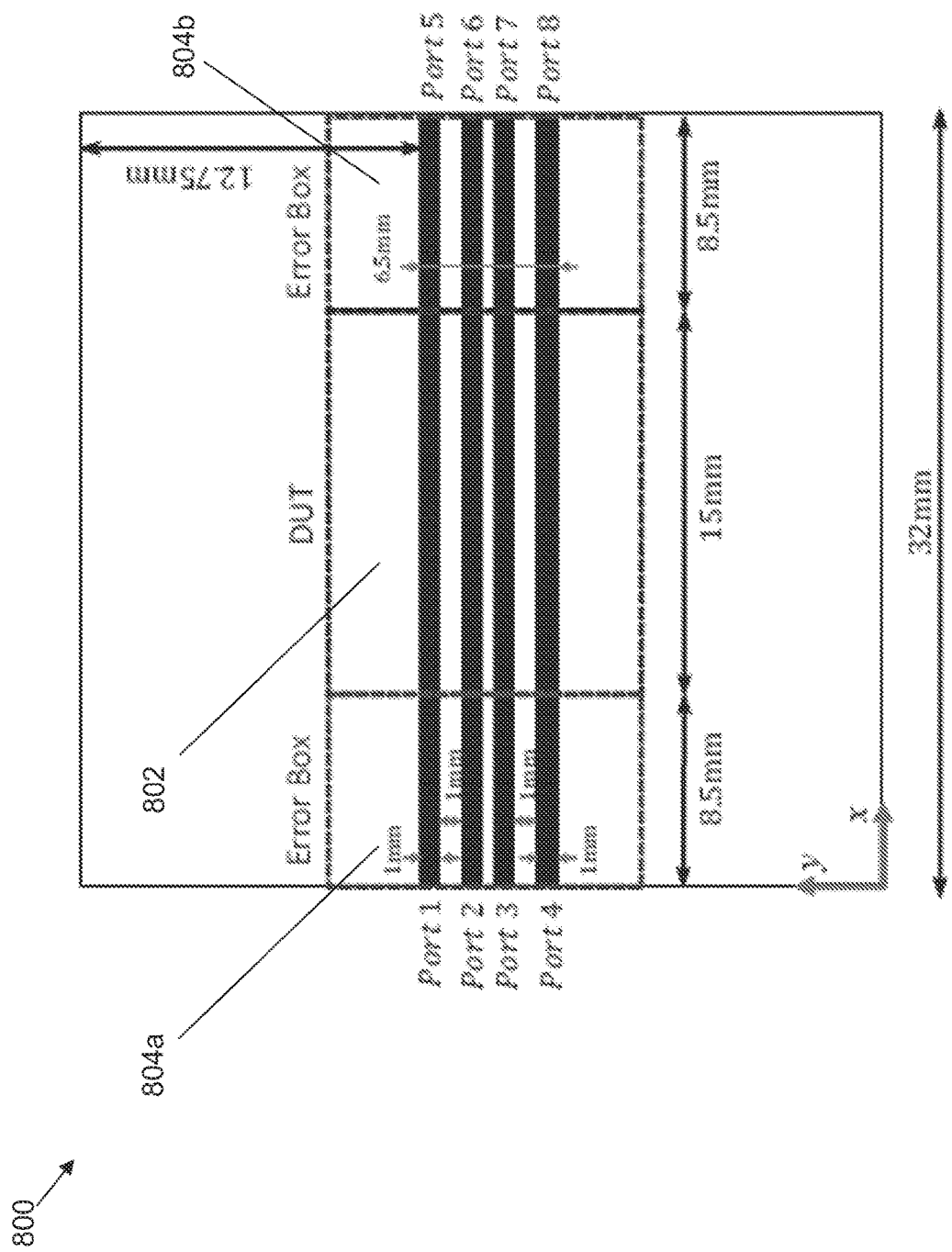
FIG. 8 shows a schematic diagram of a multilayered planar substrate, according to some implementations.

FIG. 8 shows a schematic diagram of a multilayered planar substrate 800, according to some implementations. The multilayered planar substrate 800 illustrated includes a microwave circuit 802, a feed line network 804a, and a feedline network 804b. In the example of FIG. 8, similar tests of VSOC with the incorrect and corrected definitions of the "a" and "c" blocks in the ABCD-matrix were performed for the example of the microwave circuit 802. The microwave circuit 802 and the feed line networks 804a-b are situated in the multilayered planar substrate 800, shown as a shielded layered medium depicted in FIG. 8 for the same 0.7 mm thick grounded, lossless, dielectric substrate of relative permittivity $\epsilon_r=3$.

Figure 9:
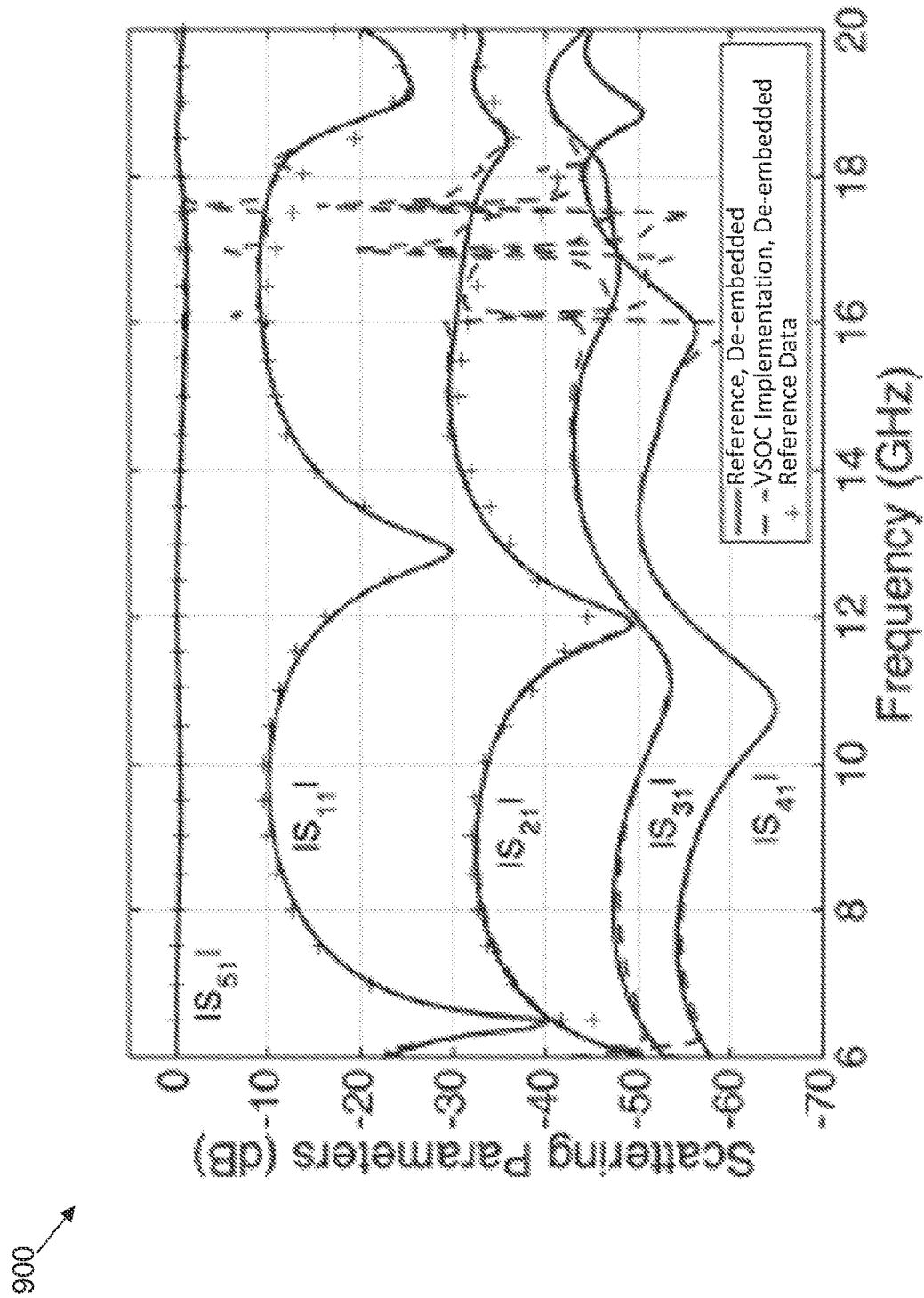
FIG. 9 is a graph of S-parameters versus frequency comparing a VSOC methodology to a reference, according to some implementations.

FIG. 9 is a graph 900 of S-parameters versus frequency comparing implementations of a VSOC methodology to a reference. The VSOC de-embedded S-parameters for the microwave circuit 802 in FIG. 8 based on erroneous definitions of "a" and "c" blocks in the ABCD-matrix are shown as the dotted line in FIG. 9. The reference is shown as the solid line.

Figure 10:
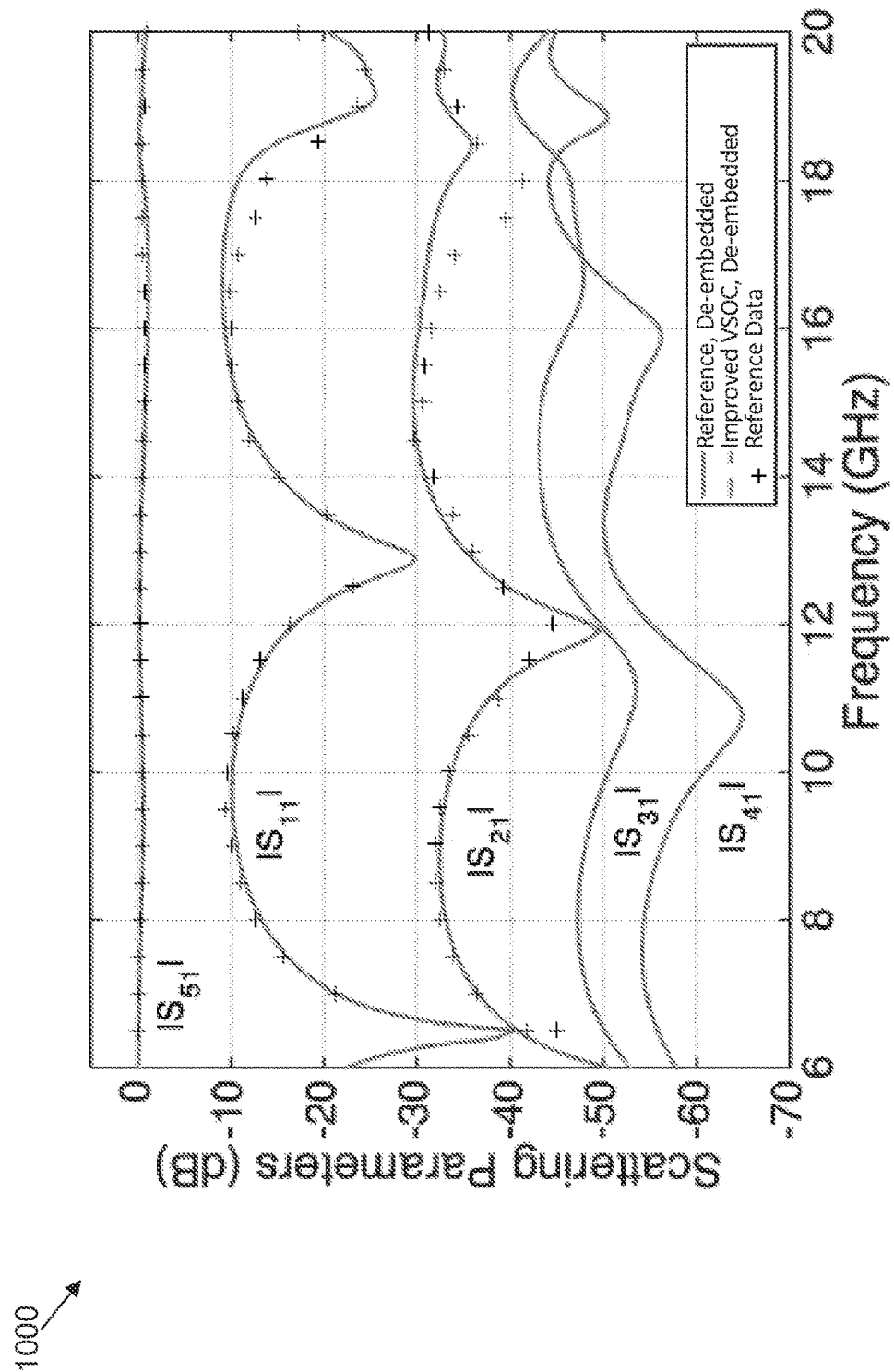
FIG. 10 is a graph of S-parameters versus frequency comparing another VSOC methodology to a reference, according to some implementations.

FIG. 10 is a graph 1000 of S-parameters versus frequency comparing an embodiment of a VSOC methodology of the present disclosure to a reference. The de-embedded S-parameters based on the corrected definition of "a" and "c" blocks in equations (3) and (4) are shown as the dotted line in FIG. 10. The reference is shown as the solid line.

Accordingly, the systems and methods discussed herein provide for using a correct VSOC methodology to de-embed feedlines and port discontinuities from microwave structures and the like. Implementations of the correct VSOC methodology facilitate more reliable network parameter analysis of microwave systems, millimeter wave systems, and digital interconnect systems. The systems and methods described herein can be applied to pre-fabrication simulation or in post-fabrication measurement.

The characterized models can be an input to a manufacturing process and the characterized physical substrates can be shipped to customers. For example, the circuit model may include an integrated circuit (IC) design layout diagram, or a design house can generate one in accordance with the circuit model. A mask house can use the IC design layout diagrams to manufacture one or more masks to be used for fabricating the various layers of a microwave structure. Mask fabrication can include one or more lithographic exposures. An IC fab can use the masks fabricated by the mask house to fabricate a wafer of the microwave structure. The wafer can be diced into die, in which each die includes one or more instances of the microwave structure.

Accurate de-embedding and characterization results in an improved product yield and compliance to specifications with stricter margins. For example, a customer can specify a maximum in-band insertion loss (characterized by some S-parameters, e.g., S21) and a minimum out-of-band rejection (characterized by some S-parameters, e.g., S12). A transmission (Tx) band may be near (e.g., within 10 MHz) in frequency to a reception (Rx) band. The customer may require a small loss in-band (e.g., S21>−4 dB or S21>−1 dB), even at the band-edge of the Rx, and a large out-of-band rejection (e.g., S12<−30 dB or S12<−40 dB) at a frequency near the Rx in-band, in order to reject the Tx band. In order to achieve such tight margins with a high yield (e.g., so that most dies and wafers pass the specification, e.g., 95% of die), the method of characterizing must be accurate. Such accuracy can be achieved by the method of de-embedding described herein.

Figure 11:
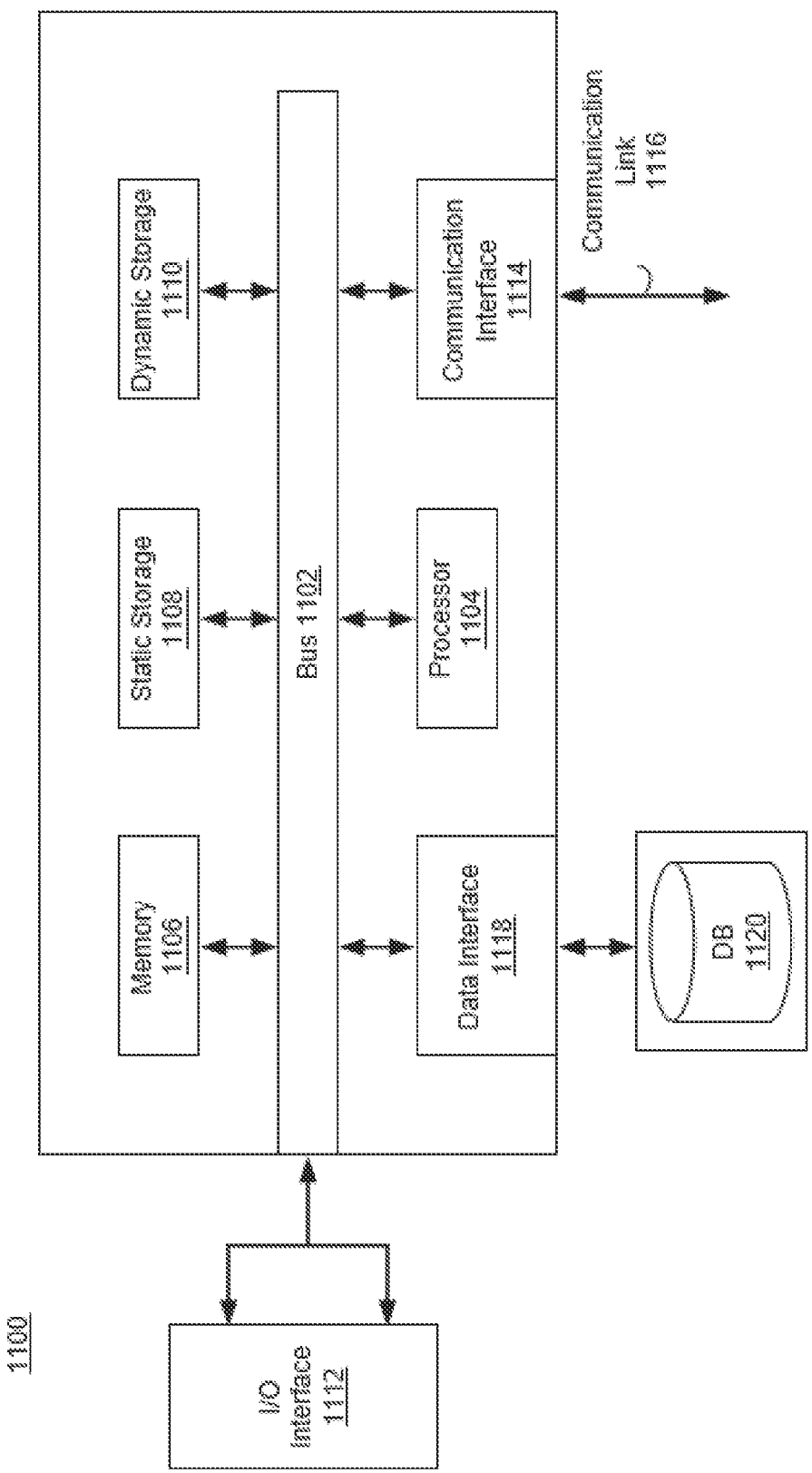
FIG. 11 is a block diagram of a computing system, according to some implementations.

Having discussed implementations of systems and methods for calculating and de-embedding feedline network parameters and discontinuous port network parameters, it may be helpful to briefly discuss computing devices useful for implementing these systems and methods. Referring to FIG. 11, illustrated is a block diagram of a computing system 1100, according to some implementations. In particular embodiments, one or more computer systems 1100 perform one or more steps of one or more methods described or illustrated herein. In particular embodiments, one or more computer systems 1100 provide functionality described or illustrated herein. In particular embodiments, software running on one or more computer systems 1100 performs one or more steps of one or more methods described or illustrated herein or provides functionality described or illustrated herein. Particular embodiments include one or more portions of one or more computer systems 1100. Herein, reference to a computer system may encompass a computing device, and vice versa. Moreover, reference to a computer system may encompass one or more computer systems.

This disclosure contemplates any suitable number of computer systems 1100. This disclosure contemplates computer system 1100 taking any suitable physical form. As example and not by way of limitation, computer system 1100 may be an embedded computer system, a system-on-chip (SOC), a single-board computer system (SBC) (such as, for example, a computer-on-module (COM) or system-on-module (SOM)), a desktop computer system, a mainframe, a mesh of computer systems, a server, a laptop or notebook computer system, a tablet computer system, or a combination of two or more of these. Computer system 1100 may include one or more computer systems 1100; be unitary or distributed; span multiple locations; span multiple machines; span multiple data centers; or reside in a cloud, which may include one or more cloud components in one or more networks. One or more computer systems 1100 may perform without substantial spatial or temporal limitation one or more steps of one or more methods described or illustrated herein. As an example and not by way of limitation, one or more computer systems 1100 may perform in real time or in batch mode one or more steps of one or more methods described or illustrated herein. One or more computer systems 1100 may perform at different times or at different locations one or more steps of one or more methods described or illustrated herein.

In some embodiments, the computer system 1100 includes a bus 1102 (e.g., an address bus and a data bus) or other communication mechanism for communicating information, which interconnects subsystems and devices, such as processor 1104, memory 1106 (e.g., RAM), static storage 1108 (e.g., ROM), dynamic storage 1110 (e.g., magnetic or optical), communication interface 1114 (e.g., modem, Ethernet card, a network interface controller (NIC) or network adapter for communicating with an Ethernet or other wire-based network, a wireless NIC (WNIC) or wireless adapter for communicating with a wireless network, such as a WI-FI network), input/output (I/O) interface 1112 (e.g., keyboard, keypad, mouse, microphone). In particular embodiments, computer system 1100 may include one or more of any such components.

In particular embodiments, processor 1104 includes hardware for executing instructions, such as those making up a computer program. As an example and not by way of limitation, to execute instructions, processor 1104 may retrieve (or fetch) the instructions from an internal register, an internal cache, memory 1106, static storage 1108, or dynamic storage 1110; decode and execute them; and then write one or more results to an internal register, an internal cache, memory 1106, static storage 1108, or dynamic storage 1110. In particular embodiments, processor 1104 may include one or more internal caches for data, instructions, or addresses. This disclosure contemplates processor 1104 including any suitable number of any suitable internal caches. As an example and not by way of limitation, processor 1104 may include one or more instruction caches, one or more data caches, and one or more translation lookaside buffers (TLBs). Instructions in the instruction caches may be copies of instructions in memory 1106, static storage 1108, or dynamic storage 1110, and the instruction caches may speed up retrieval of those instructions by processor 1104. Data in the data caches may be copies of data in memory 1106, static storage 1108, or dynamic storage 1110 for instructions executing at processor 1104 to operate on; the results of previous instructions executed at processor 1104 for access by subsequent instructions executing at processor 1104 or for writing to memory 1106, static storage 1108, or dynamic storage 1110; or other suitable data. The data caches may speed up read or write operations by processor 1104. The TLBs may speed up virtual-address translation for processor 1104. In particular embodiments, processor 1104 may include one or more internal registers for data, instructions, or addresses. This disclosure contemplates processor 1104 including any suitable number of any suitable internal registers. Processor 1104 may include one or more arithmetic logic units (ALUs); be a multi-core processor; or include one or more processors 1104. Although this disclosure describes and illustrates a particular processor, this disclosure contemplates any suitable processor.

In particular embodiments, I/O interface 1112 includes hardware, software, or both, providing one or more interfaces for communication between computer system 1100 and one or more I/O devices. Computer system 1100 may include one or more of these I/O devices. One or more of these I/O devices may enable communication between a person and computer system 1100. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1112 for them. I/O interface 1112 may include one or more device or software drivers enabling processor 1104 to drive one or more of these I/O devices. I/O interface 1112 may include one or more I/O interfaces 1112. Although this disclosure describes and illustrates a particular I/O interface, this disclosure contemplates any suitable I/O interface.

In particular embodiments, communication interface 1114 includes hardware, software, or both providing one or more interfaces for communication (such as, for example, packet-based communication) between computer system 1100 and one or more other computer systems 1100 or one or more networks. As an example and not by way of limitation, communication interface 1114 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1114 for it. As an example and not by way of limitation, computer system 1100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1100 may include any suitable communication interface 1114 for any of these networks. Communication interface 1114 may include one or more communication interfaces 1114. Although this disclosure describes and illustrates a particular communication interface, this disclosure contemplates any suitable communication interface.

One or more memory buses (which may each include an address bus and a data bus) may couple processor 1104 to memory 1106. Bus 1102 may include one or more memory buses, as described below. In particular embodiments, one or more memory management units (MMUs) reside between processor 1104 and memory 1106 and facilitate accesses to memory 1106 requested by processor 1104. In particular embodiments, memory 1106 includes random access memory (RAM). This RAM may be volatile memory, dynamic RAM (DRAM) or static RAM (SRAM). Moreover, this RAM may be single-ported or multi-ported RAM. This disclosure contemplates any suitable RAM. Memory 1106 may include one or more memories 1106. Although this disclosure describes and illustrates particular memory, this disclosure contemplates any suitable memory.

The ROM may be mask-programmed ROM, programmable ROM (PROM), erasable PROM (EPROM), electrically erasable PROM (EEPROM), electrically alterable ROM (EAROM), or flash memory or a combination of two or more of these. In particular embodiments, dynamic storage 1110 may include a hard disk drive (HDD), a floppy disk drive, flash memory, an optical disc, a magneto-optical disc, magnetic tape, or a Universal Serial Bus (USB) drive or a combination of two or more of these. Dynamic storage 1110 may include removable or non-removable (or fixed) media. Dynamic storage 1110 may be internal or external to computer system 1100. This disclosure contemplates mass dynamic storage 1110 taking any suitable physical form. Dynamic storage 1110 may include one or more storage control units facilitating communication between processor 1104 and dynamic storage 1110.

In particular embodiments, bus 1102 includes hardware, software, or both coupling components of computer system 1100 to each other. As an example and not by way of limitation, bus 1102 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1102 may include one or more buses. Although this disclosure describes and illustrates a particular bus, this disclosure contemplates any suitable bus or interconnects.

In some embodiments, computer system 1100 performs specific operations by processor 1104 executing one or more sequences of one or more instructions contained in memory 1106. Such instructions may be read into memory 1106 from another computer readable/usable medium, such as static storage 1108 or dynamic storage 1110. In alternative embodiments, hard-wired circuitry may be used in place of or in combination with software instructions to implement particular embodiments. Thus, particular embodiments are not limited to any specific combination of hardware circuitry and/or software. In particular embodiments, the term "logic" shall mean any combination of software or hardware that is used.

The term "computer readable medium" or "computer usable medium" as used herein refers to any medium that participates in providing instructions to processor 1104 for execution. Such a medium may take many forms, including but not limited to, nonvolatile media and volatile media. Non-volatile media includes, for example, optical or magnetic disks, such as static storage 1108 or dynamic storage 1110. Volatile media includes dynamic memory, such as memory 1106.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In particular embodiments, execution of the sequences of instructions may be performed by a single computer system 1100; in alternative embodiments, two or more computer systems 1100 coupled by communication link 1116 (e.g., LAN, PTSN, or wireless network) may perform the sequence of instructions in coordination with one another.

Computer system 1100 may transmit and receive messages, data, and instructions, including program, i.e., application code, through communication link 1116 and communication interface 1114. Received program code may be executed by processor 1104 as it is received, and/or stored in static storage 1108 or dynamic storage 1110, or other non-volatile storage for later execution. A database 1120 may be used to store data accessible by the system 1100 by way of data interface 1118.

Herein, a non-transitory computer readable medium (also referred to as "computer-readable non-transitory storage medium") includes instructions, when executed, cause a processor to execute various functionalities described herein. In some embodiments, a computer-readable non-transitory storage medium or media may be embodied as one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDS), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these. A computer-readable non-transitory storage medium may be volatile, non-volatile, or a combination of volatile and non-volatile.

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A method comprising:
   measuring network parameters of a multilayered planar substrate including a microwave circuit and a feed line with a first port at a reference plane coupled to the microwave circuit and a second port coinciding with a boundary of the multilayered planar substrate;
   measuring, with reference to the first port and the second port, an open-circuit current, a first short-circuit current, and a second short-circuit current;
   obtaining network parameters of the feed line using a short-open-calibration (SOC) according to an ABCD-matrix, wherein an "a" block of the ABCD-matrix comprises a first matrix multiplied by a transpose of the first short-circuit current, wherein the first matrix is an inverse of a difference of the open-circuit current and the second short-circuit current, and wherein a "c" block of the ABCD-matrix comprises the open-circuit current multiplied by the "a" block;
   de-embedding the network parameters of the feed line from the network parameters of the multilayered planar substrate to obtain microwave circuit network parameters;
   comparing the microwave circuit network parameters to a specified range; and
   responsive to the microwave circuit network parameters being within or not within the specified range, respectively approving or rejecting customer shipment of the microwave circuit.

2. The method of claim 1, wherein the open-circuit current is a first current at the first port with the second port open circuited, the first short-circuit current is a second current at the second port with the second port short circuited, and the second short-circuit current is a third current at the first port with the second port short circuited.

3. The method of claim 1, wherein the first port is a plurality of first ports, the second port is a plurality of second ports, the feed line is a plurality of feed lines, and the SOC is a vector-SOC (VSOC).

4. The method of claim 1, wherein the feed line generates a port discontinuity that is de-embedded in obtaining the microwave circuit network parameters.

5. The method of claim 1, wherein network parameters of the multilayered planar substrate include S-parameters and the network parameters of the feed line include ABCD-parameters.

6. The method of claim 5, the method further comprising converting the ABCD-parameters of the feed line to S-parameters of the feed line.

7. The method of claim 1, wherein the microwave circuit is a distributed microwave circuit.

8. The method of claim 1, wherein the microwave circuit is a multiport microwave circuit.

9. The method of claim 1, wherein the multilayered planar substrate is a printed circuit board.

10. A system comprising:
    a multilayered planar substrate including a microwave circuit and a feed line with a first port at a reference plane coupled to the microwave circuit and a second port coinciding with a boundary of the multilayered planar substrate; and
    test equipment configured to:
    measure, with reference to the first port and the second port, an open-circuit current, a first short-circuit current, and a second short-circuit current;
    obtain network parameters of the feed line using a short-open-calibration (SOC) according to an ABCD-matrix, wherein an "a" block of the ABCD-matrix comprises a first matrix multiplied by a transpose of the first short-circuit current, wherein the first matrix is an inverse of a difference of the open-circuit current and the second short-circuit current, and wherein a "c" block of the ABCD-matrix comprises the open-circuit current multiplied by the a block;
    de-embed the feed line to obtain microwave circuit network parameters;
    compare the microwave circuit network parameters to a specified range; and
    responsive to the microwave circuit network parameters being within or not within the specified range, respectively indicate passing or failing specifications for the microwave circuit.

11. The system of claim 10, wherein the open-circuit current is a first current at the first port with the second port open circuited, the first short-circuit current is a second current at the second port with the second port short circuited, and the second short-circuit current is a third current at the first port with the second port short circuited.

12. The system of claim 10, wherein the first port is a plurality of first ports, the second port is a plurality of second ports, the feed line is a plurality of feed lines, and the SOC is a vector-SOC (VSOC).

13. The system of claim 10, wherein the feed line generates a port discontinuity that is de-embedded in obtaining the microwave circuit network parameters.

14. The system of claim 10, wherein network parameters of the multilayered planar substrate include S-parameters and the network parameters of the feed line include ABCD-parameters.

15. The system of claim 14, the test equipment further configured to convert the ABCD-parameters of the feed line to S-parameters of the feed line.

16. The system of claim 10, wherein the microwave circuit is a distributed microwave circuit.

17. The system of claim 10, wherein the microwave circuit is a multiport microwave circuit.

18. The system of claim 10, wherein the multilayered planar substrate is a printed circuit board.

19. A method comprising:
    simulating network parameters of a microwave circuit model including a reference port associated with a reference plane within the microwave circuit model and an external port coinciding with a boundary of the microwave circuit model;

simulating, with reference to the reference port and the external port, an open-circuit current, a first short-circuit current, and a second short-circuit current;

obtaining network parameters between the reference port and the external port using a short-open-calibration (SOC) according to an ABCD-matrix, wherein an "a" block of the ABCD-matrix comprises a first matrix multiplied by a transpose of the first short-circuit current, wherein the first matrix is an inverse of a difference of the open-circuit current and the second short-circuit current, and wherein a "c" block of the ABCD-matrix comprises the open-circuit current multiplied by the "a" block;

de-embedding discontinuities of the external port to obtain de-embedded microwave circuit model network parameters;

comparing the de-embedded microwave circuit model network parameters to a specified range; and responsive to the de-embedded microwave circuit model network parameters being within or not within the specified range, respectively determining to use or not use the microwave circuit model as an input to a manufacturing process.

20. The method of claim 19, wherein the reference port is coupled to the external port with a feed line.

* * * * *